United States Patent [19]

Elliott

[11] Patent Number: 4,952,811
[45] Date of Patent: Aug. 28, 1990

[54] FIELD INDUCED GAP INFRARED DETECTOR

[75] Inventor: C. Thomas Elliott, Malvern, England

[73] Assignee: The United States of America as represented by the Administrator of the National Aeronautics and Space Administration, Washington, D.C.

[21] Appl. No.: 369,403

[22] Filed: Jun. 21, 1989

[51] Int. Cl.$^5$ ............................. G01J 5/00; G01J 5/06
[52] U.S. Cl. ............................ 250/370.13; 250/338.1; 250/338.2; 250/493.1; 250/370.12; 357/30; 357/27; 357/61
[58] Field of Search ............... 250/338.1, 338.2, 338.4, 250/370.06, 370.12, 370.13, 370.14, 493.1; 357/27, 30 B, 30 C, 30 H, 30 L, 30 P, 17

[56] References Cited

U.S. PATENT DOCUMENTS

| | | | |
|---|---|---|---|
| 3,274,387 | 9/1966 | Putley | 250/352 |
| 3,496,024 | 2/1970 | Ruehrwein | 136/254 |
| 4,749,952 | 6/1988 | Morimoto | 330/4.3 |
| 4,785,186 | 11/1988 | Street et al. | 250/370.14 |
| 4,801,991 | 1/1989 | Hisa | 357/30 |

OTHER PUBLICATIONS

E. R. Gertner et al., "HgCdTe on Sapphire—A New Approach to Infrared Detector Arrays", J. Crystal Growth, 72, 462–467 (1985).
Harmon, "Properties of Mercury Chalcogenides", Physics and Chemistry of II–VI Compounds, North-Holland Publishing Company, 1967, p. 803.
Lovett, "Semimetals & Narrow-Bandgap Semiconductors", pp. 1, 4, 5.
Omar, "Elementary Solid State Physics: Principles and Applications", Addison-Wesley Publishing Co., pp. 210–212.
R. A. Reidel et al., "High Performance Photovoltaic Infrared Devices in $Hg_{1-x}Cd_xTe$ on Sapphire", Appl. Phys. Lett., 46 (1), 64–66 (1985).
L. O. Bubulac et al., "Boron and Indium Ion-Implanted Junctions in HgCdTe Grown on CdTe and CdTe/Al$_2$O$_3$", J. Vac. Sci. Technol., A 4 (4), 2169–2173 (1986).
R. Kay et al., "HgCdTe Photovoltaic Detectors on Si Substrates", Appl. Phys. Lett., 21 (26), 2211 (1987).
J. P. Rode, Infrared Physics, 124, 443 (1984).
P. Byszewski et al., "Magnetic-Field-Induced Energy Gap in HgTe", Phys. Stat. Sol., (b) 71, 117–124 (1975).
Y. Geldner et al., "Magnetooptical Investigation of $Hg_{1-x}Cd_2Te$ Mixed Crystals", Phys. Stat. Sol., (b) 82, 149–159 (1977).
W. Zawadzki et al., "Anisotropic Effects Induced by Magnetic Field on Zero-Gap Semiconductors", Solid State Commum., 15, 303–306 (1974).
C. T. Elliott et al., Phys. Rev., 5, 2985–2997 (1972).

Primary Examiner—Constantine Hannaher
Assistant Examiner—Edward J. Glick
Attorney, Agent, or Firm—Thomas H. Jones; John R. Manning

[57] ABSTRACT

A tunable infrared detector employing a vanishing band gap semimetal material which is provided with an induced band gap by a magnetic field to allow intrinsic semiconductor type infrared detection capabilities. The semimetal material may thus operate as a semiconductor type detector with a wavelength sensitivity corresponding to the induced band gap in a preferred embodiment of a diode structure. Preferred semimetal materials include $Hg_{1-x}Cd_xTe$, $x<0.15$, HgCdSe, BiSb, $\alpha$-Sn, HgMgTe, HgMnTe, HgZnTe, HgMnSe, HgMgSe, and HgZnSe. The magnetic field induces a band gap in the semimetal material proportional to the strength of the magnetic field allowing tunable detection cutoff wavelengths. For an applied magnetic field from 5 to 10 Tesla, the wavelength detection cutoff will be in the range of 20–50 microns for $Hg_{1-x}Cd_xTe$ alloys with x about 0.15. A similar approach may also be employed to generate infrared energy in a desired wavelength by using the magnetic field to induce the desired band gap and then operating the structure in a light emitting diode or semiconductor laser type of configuration.

16 Claims, 8 Drawing Sheets

FIELD INDUCED GAP INFRARED DETECTOR

BACKGROUND OF THE INVENTION

1. Origin of the Invention.

The invention described herein was made in the performance of work under a NASA contract, and is subject to the provisions of Public Law 96-517 (35 U.S.C. §202) in which the Contractor has elected not to retain title.

2. Field of the Invention.

The present invention relates to apparatus and methods for detecting infrared radiation. Additionally, the present invention relates to apparatus and methods for generating infrared radiation.

3. Description of the Prior Art and Related Information

The detection of infrared radiation in the long wavelength region, for example, beyond about 15 microns, is important for a variety of applications including astronomy, earth sensing from space, etc. The detection of infrared radiation in this long wavelength region, however, presents considerable difficulties for presently known detection approaches. Such presently known approaches generally employ one of three categories of detectors: (1) extrinsic photoconducting semiconductors; (2) bolometers; and (3) intrinsic photoconducting semiconductors. All three types of detectors have significant shortcomings when applied to the long wavelength infrared radiation regime.

Extrinsic photoconducting semiconductors employ semiconductors doped with very small amounts of impurities to provide infrared detection through photoconduction. The impurities act to change the conduction properties of the semiconductor when it absorbs infrared radiation. These extrinsic infrared detectors are very sensitive to the amount of dopant and to the processing of the doped semiconductor material. As a result, it is difficult to repeatedly control the detection characteristics of such extrinsic infrared detectors. Also, extrinsic infrared detectors suffer from very low efficiency of detection and susceptibility to noise. Although the noise may be reduced by means of cryogenic cooling to very low temperatures, for example 1° K., the weight, size, cost and logistic penalties of such cryogenics introduce significant practical problems.

Bolometer infrared detectors employ the conversion of the incident infrared energy to heat. The heat is in turn measured by means of a temperature rise in the bolometer. Undoped silicon is frequently employed as a bolometer material. Bolometers have high noise at elevated temperatures Bolometers, therefore, require cooling to extremely low temperatures to provide suitable sensitivity and signal to noise ratios; for example, cooling to as low as 0.1° K. is required for applications requiring good sensitivity. It will be appreciated that cooling to this very low temperature requires extremely sophisticated and expensive cryogenics. Also, bolometers employed as infrared detectors are unable to discriminate between wavelengths since any incident radiation will result in some absorption and some heating of the material. Accordingly, bolometers are not suitable for applications requiring the detector to provide a wavelength discrimination or photospectrometry function.

The most desirable infrared detectors for most applications are intrinsic semiconductor devices which employ absorption of photons across the forbidden energy gap of the semiconductor to create electron/hole pairs which carriers in turn create a detectable current or potential. While these intrinsic semiconductor devices are effective at shorter wavelength regimes, for longer wavelengths, beyond 8 microns, for example, no easily prepared semiconductor materials are available. By carefully tailoring alloys of semiconductors, it has been possible to obtain materials suitable for intrinsic photodetection in the 8-14 micron regime. For example, the alloys $Hg_{1-x}Cd_xTe$ or $Pb_xSn_{1-x}Te$, where the energy gap is carefully controlled by control of x, have been employed. For achieving intrinsic semiconductor detectors for the infrared region beyond wavelengths of about 14 microns, however, the control necessary in the composition of such alloy semiconductors is too demanding to make such detectors a practical solution.

Accordingly, a need presently exists for an efficient infrared detection device for wavelengths in the infrared region beyond approximately 14 microns. Additionally, a need presently exists for a long wavelength infrared detector having good signal to noise ratios at elevated temperatures. A need further exists for an infrared detector having wavelength discrimination capabilities.

SUMMARY OF THE INVENTION

The present invention provides an infrared detector for detection of infrared radiation in the region of 15 microns and beyond without requiring ultra low cryogenic cooling.

The present invention further provides an infrared detector having a tunable wavelength detection capability in the far infrared region.

The present invention further provides an infrared spectrometer capable of discriminating frequencies in the far infrared region.

The infrared detector of the present invention employs a semimetal material, normally having a vanishing band gap, which is provided with an induced band gap by means of a magnetic field. Due to the induced band gap of the semimetal material, the detector operates to detect incident radiation in the same manner as an "intrinsic" semiconductor detector. For example, in one embodiment, a photodiode structure may be employed. The amount of the induced band gap is varied by the strength of the magnetic field, providing a variable wavelength sensitivity for the detector. Suitable semimetal materials include $Hg_{1-x}Cd_xTe$, $x<0.15$, HgCdSe, BiSb, —Sn, HgMgTe, HgMnTe, HgZnTe, HgMnSe, HgMgSe, HgZnSe and the graphite form of carbon. Other semimetal materials may also be employed. The strength of magnetic field required varies with the wavelength desired and the specific semimetal material. For example, for $Hg_{0.85}Cd_{0.15}Te$, fields in the range of 1-10 Tesla will provide infrared detection with a cutoff wavelength in the 15-75 micron region. Increasing or decreasing the magnetic field strength within available ranges will decrease or increase the cutoff wavelength, respectively.

The present invention further provides an infrared spectrometer which employs a filter layer of semimetal material over a detector layer of semimetal material of differing composition such that an applied magnetic field causes an induced band gap of differing energy in the two semimetal materials. This provides a pass band detection region of wavelength corresponding to the difference in the energy gap induced in the two semimetal materials Alternatively, the same materials may be employed for both the filter layer and the detector layer with different strength magnetic fields applied to the filter layer and detector layer, respectively, to induce a disparate shift in the band gap.

The present invention further provides a tunable source of infrared radiation employing a light emitting diode structure employing a semimetal material. An induced band gap is created in the semimetal material by a magnetic field applied to the diode structure. A potential applied across the diode junction causes electron/hole pair recombination and light emission as in a conventional light emitting diode. Since the energy of the photons emitted by the light emitting diode depends on the band gap of the material, a variable wavelength light emitting structure may be provided with the magnetic field strength determining the wavelength of the emitted light.

DETAILED DESCRIPTION OF THE INVENTION

Figure 1:
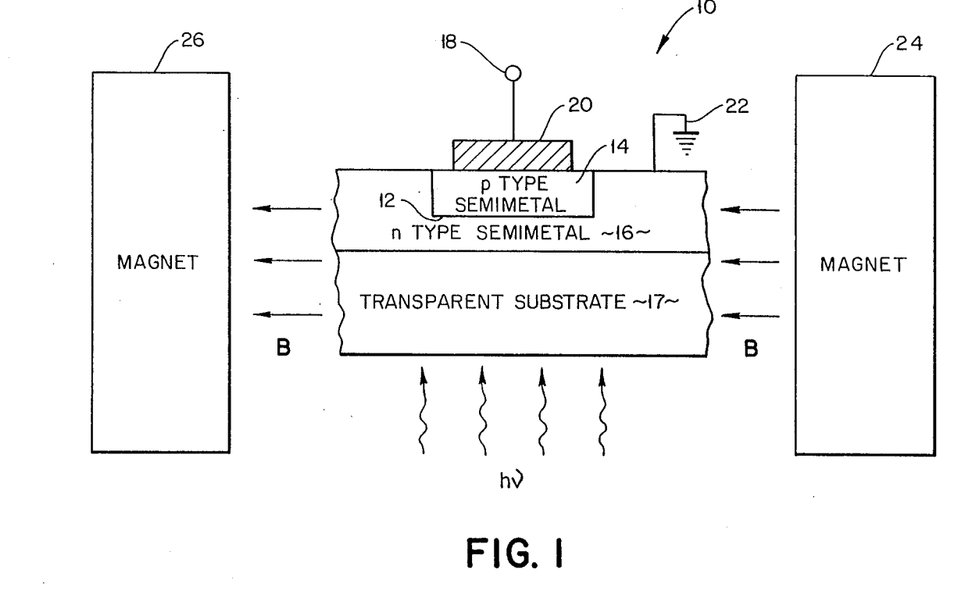
FIG. 1 is a cross-sectional view of a preferred embodiment of the infrared detector of the present invention.

Referring to FIG. 1, a preferred embodiment of the infrared detector 10 of the present invention is illustrated in a cross-sectional view.

The infrared detector 10 employs a photodiode junction 12 formed by a p type semimetal region 14 implanted into a thin n type semimetal layer 16 formed on a transparent substrate 17. The layer 16 should have a thickness to allow the incident infrared radiation to be absorbed adjacent junction 12 The thickness will be in general dependent on the radiation wavelength and intensity and the material For example, for HgCdTe and incident infrared radiation a thickness of 5-10 microns may be suitable The n type semimetal layer 16 is maintained at a bias potential, for example, ground, by connection 22. As illustrated in FIG. 1, the infrared radiation to be detected is incident on the bottom of the detector 10 through the substate 17. It will be appreciated, however, that various other configurations are possible depending on the specific application. The infrared detector 10 employs two high strength magnets 24, 26 for providing a substantially uniform magnetic field B running directly through the n type semimetal layer 16 and p type semimetal region 14. Although the magnets 24, 26 are illustrated as separate in FIG. 1, it will be appreciated that they may also represent opposite poles of a large magnet of size suitable to allow positioning of the semimetal layer 16 in between the poles. As will be described in more detail below in relation to FIGS. 2(a) and 2(b), the magnetic field B induces a band gap into the semimetal material. Due to the induced band gap in semimetal regions 14 and 16, the detector 10 will operate in the same manner as an intrinsic semiconductor photodetector with a detection wavelength determined by the strength of the magnetic field B and the composition of the semimetal material That is, incident infrared radiation will create hole/electron pairs which are swept across the electric field gradient at the pn junction 12 to cause a detectable signal at electrode 18 through electrode contact metallization 20.

The formation of the p type region 14 and junction 12 may be done in a conventional manner such as employed in formation of conventional intrinsic semiconductor photodiodes. For example, as will be discussed below, one suitable semimetal material for use in the present invention is $Hg_{1-x}Cd_xTe$, with $x<0.15$. For values of $x>0.15$, $Hg_{1-x}Cd_xTe$ is a semiconductor and has been commonly employed as an intrinsic semiconductor photodiode. Photodiode junctions of $Hg_{1-x}Cd_xTe$ have been formed using a variety of techniques and a variety of underlying substrates have been employed. See, for example, E. R. Gertner et al., "HgCdTe on Sapphire—A New Approach to Infrared Detector Arrays", *J. Crystal Growth,* 72, 462-467 (1985), R. A. Reidel et al., "High Performance Photovoltaic Infrared Devices in $Hg_{1-x}Cd_xTe$ on Sapphire", *Appl. Phys. Lett.,* 46 (1), 64-66 (1985), E. R. Gertner et al., "High Performance Photovoltaic Infrared Devices in $Hg_{1-x}Cd_xTe$ on GaAs", *Appl. Phys. Lett.,* 46 (9), 851-853 (1985), L. O. Bubulac et al., "Boron and Indium Ion-Implanted Junctions in HgCdTe Grown on CdTe and $CdTe/Al_2O_3$", *J. Vac. Sci. Technol.,* A 4 (4), 2169-2173 (1986), and R. Kay et al., "HgCdTe Photovoltaic Detectors on Si Substrates", *Appl. Phys. Lett.,* 21 (26), 2211 (1987). Thus, for example, a HgCdTe photodiode structure, as generally indicated in FIG. 1, may be formed on a transparent substrate 17 of CdTe or on a base substrate of different material. As examples of such substrates 17, Si, GaAs, InSb, Te and $Al_2O_3$ may be employed. A variety of techniques may be employed to deposit epitaxial layers of HgCdTe or CdTe on such substrates, including molecular beam epitaxy, organometallic deposition, vapor phase epitaxy, laser ablation, etc.

In FIG. 1, the layer 16 is illustrated in a broken away view, corresponding to the possibility of providing an extended substrate with an array of individual photojunction regions 12 formed therein. An array of photodiodes is particularly suitable for sensing applications where focal plane arrays of photojunction diodes are commonly employed. See, for example, J. P. Rode, *Infrared Physics,* 124, 443 (1984) for an illustration of a typical focal plane array of the type commonly employed for infrared sensing applications. In such applications the array of photojunction diodes is typically bump bonded through In bump bonds, corresponding to electrode 20 in FIG. 1, to a matching silicon VLSI signal processing circuit. In the present invention a wider gap could be used when reading out the detector to that used when detecting the radiation. This would make it very much easier to achieve efficient transfer of charge into a CCD for example. A single photojunction may also be employed, however.

It will be also appreciated by those skilled in the art that the infrared detector of the present invention may be employed in various other configurations than that illustrated in FIG. 1, such other configurations corresponding to those commonly used for intrinsic semiconductor detectors.

Figure 2A:
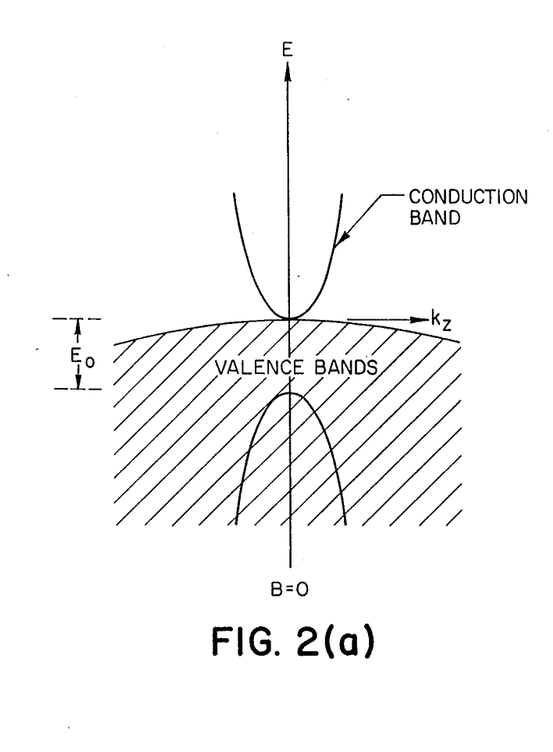
FIGS. 2(a) and 2(b) are drawings illustrating the field induced band gap structure of semimetal materials of the type employed by the infrared detector of the present invention.
Figure 2B:
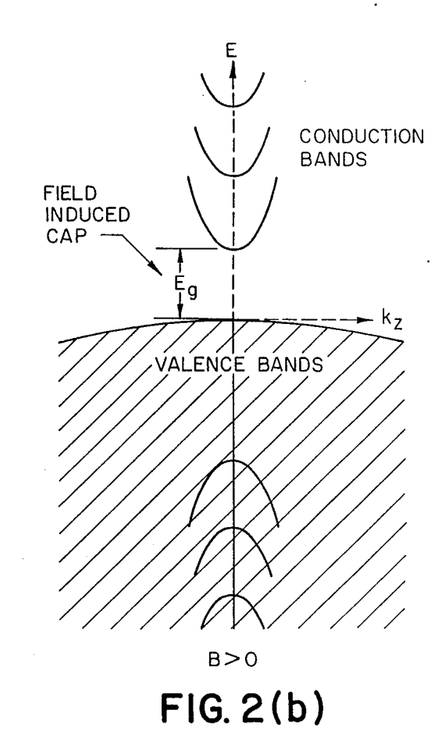

Referring to FIGS. 2(a) and 2(b), the effect of an applied magnetic field on the band gap structure of the semimetal materials employed in the present invention is illustrated.

FIGS. 2(a) and 2(b) illustrate the band structure for semimetals of the grey-tin type with the band extrema at the Brillouin zone center; examples are $\alpha$-Sn, HgTe, HgSe and $Hg_{1-x}Cd_xTe$ (x<0-0.15). Semimetals in general, and of this type in particular, have very small carrier masses and as a consequence they can exhibit large changes in their optical properties and electrical transport properties in the presence of magnetic fields. Other suitable semimetal materials of this type include HgCdSe, BiSb, $\alpha$-Sn, HgMgTe, HgMnTe, HgZnTe, HgMnSe, HgMgSe, HgZnSe and the graphite form of carbon. The band structure of these semimetal materials is substantially modified in the presence of a magnetic field by the formation of one dimensional magnetic sub-bands. See, e.g., P. Byszewski et al., "Magnetic-Field-Induced Energy Gap in HgTe", Phys Stat. Sol., (b) 71, 117-124 (1975), Y. Geldner et al., "Magnetooptical Investigation of $Hg_{1-x}Cd_xTe$ Mixed Crystals", Phys Stat Sol., (b) 82, 149-158 (1977) and W. Zawadzki et al., "Anisotropic Effects Induced by Magnetic Field in Zero-Gap Semiconductors", Solid State Commum., 15, 303-306 (1974). The field induced gap between the maximum in the heavy hole band and the lowest conduction band minimum, i.e., the zero order spin-split down Landau level is given by $$E_g = \frac{-E_o}{2} + \left( \frac{E_o^2}{4} + \frac{hqB}{2m_o^*} - \tfrac{1}{2}\mu_B |g^*| B \right)^{\tfrac{1}{2}}$$

where $\mu_B$ is a Bohr magneton, $g^* = -m/m_o^*$ is the g value at the bottom of the band, and the effective mass at the band edge is given by $$m_o^{*-1} = 4P^2/3\hbar^2 E_o$$

where P is the Kane matrix element. See, e.g., E. O. Kane, in Semiconductors and Semimetals, R. K. Willardson and A. C. Beer, eds. (Academic Press, N.Y. 1966), vol. 1, 75 and C. T. Elliott et al., Phys. Rev., 5, 2985-2997 (1972).

Since the optical transition from the $\Gamma 8$ heavy hole band to the lowest spin-split down Landau level is allowed for radiation with the electric field vector in the z direction, the absorption coefficient will be high and the detector will have good efficiency.

Figure 3:
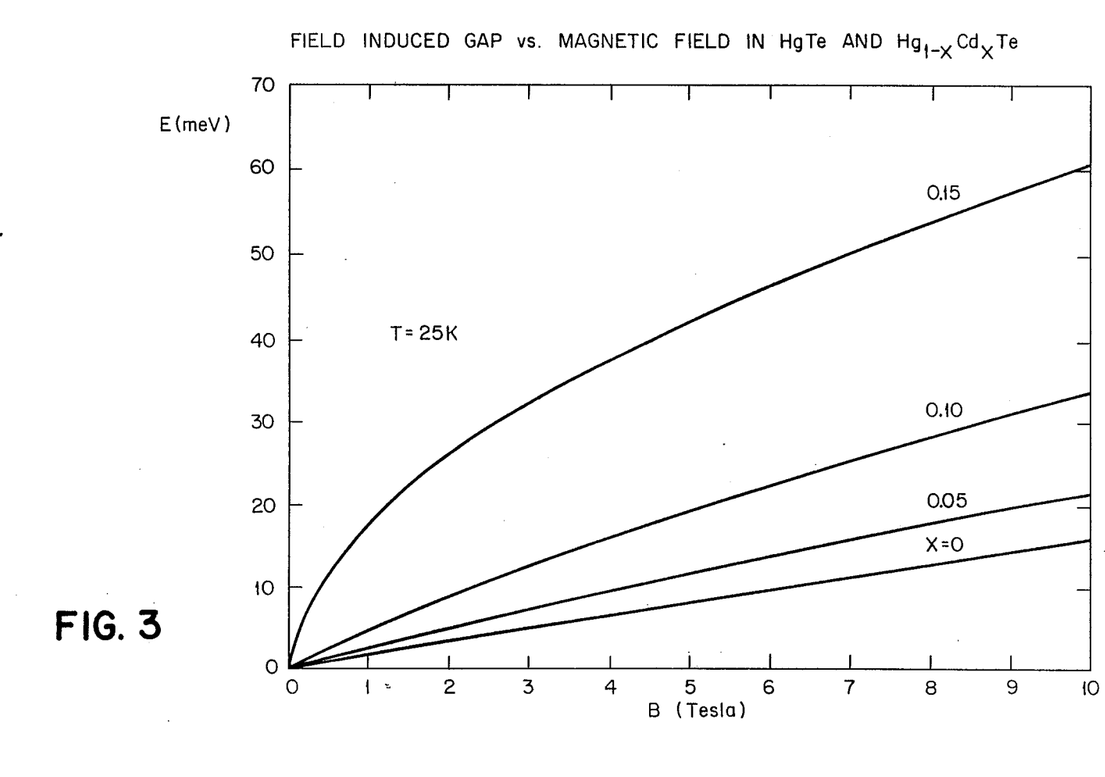
FIG. 3 is a drawing illustrating the calculated relationship of field induced band gap energy vs. magnetic field for HgTe and $Hg_{1-x}Cd_xTe$.

Referring to FIG. 3, plots of the calculated energy gap vs. magnetic field employing this equation are shown for HgTe and $Hg_{1-x}Cd_xTe$ alloys with x=0, 0.05, 0.10 and 0.15.

Figure 4:
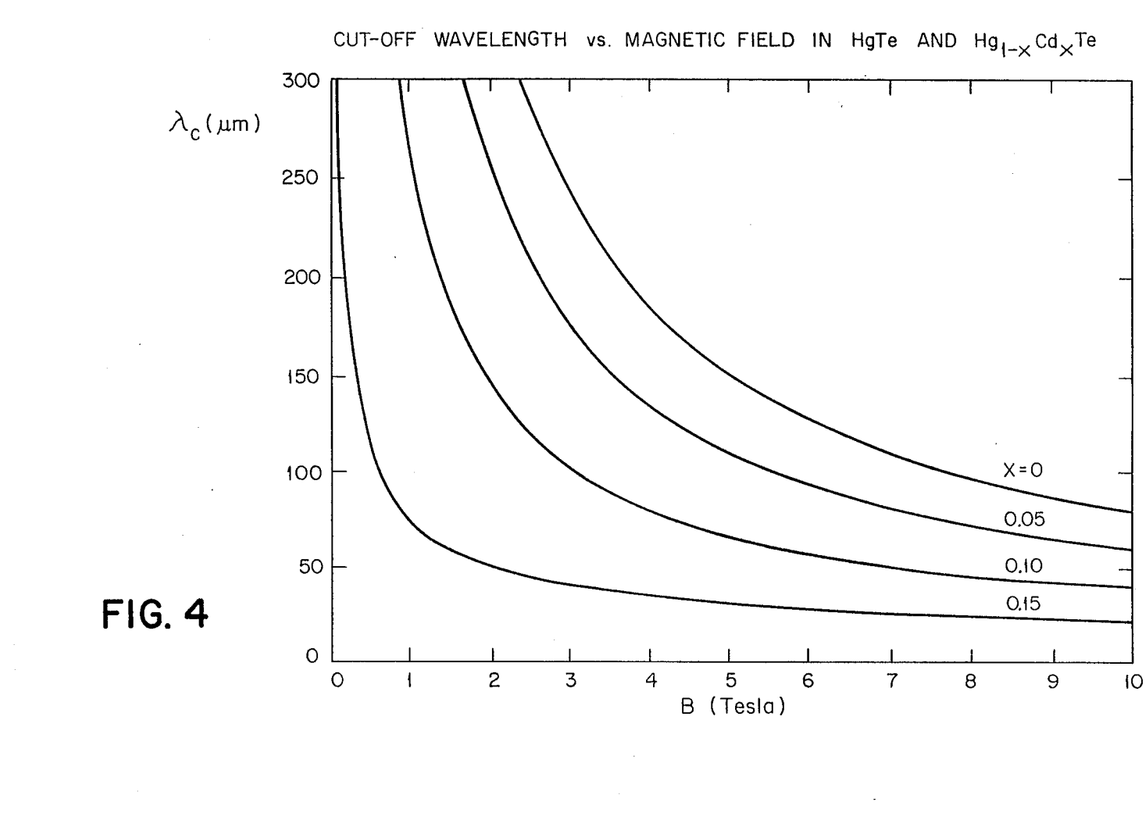
FIG. 4 is a drawing illustrating the calculated cutoff wavelength vs. applied magnetic field for $Hg_{1-x}Cd_xTe$.

In FIG. 4, the corresponding values of the cutoff wavelengths $\lambda c$ for the detector of the present invention employing these semimetal alloys is shown. It may be seen that with relatively small magnetic fields HgTe, i.e., x=0, is suitable for detection of radiation in the far infrared and the submillimeter wavelength regions For example, for a field of 10 Tesla, $\lambda c$, the long wavelength cutoff, is about 80 $\mu$m. The range of the cutoff may be varied with other alloys. The largest band gap and shortest cutoff is obtained with x=0.15, the composition for which the $\Gamma 6$ - $\Gamma 8$ gap, $E_o$, is almost zero. For this composition the cutoff is about 20 $\mu$m in a 10 Tesla magnetic field. A further consideration affecting the choice of magnetic field is that in order to avoid significant collision broadening of the Landau levels, the product $\mu B$ needs to approach 100, where $\mu$ is in meter units and B is in Tesla. Thus for semimetals where the electron mobility approaches $10^2 m^2 v^{-1} S^{-1}$ at low temperatures, a B of order 1 Tesla or greater is preferred.

Accordingly, it will be appreciated that a suitable magnetic field to provide a desired wavelength cutoff in accordance with a specific application may be selected from the $\lambda c$ curves in FIG. 4. Also, it will be appreciated that curves analogous to those illustrated in FIGS. 3 and 4 may be readily generated by those skilled in the art for other semimetal materials. From these curves, the suitable magnetic field may be chosen for providing detection over a broad range of wavelength regions.

Figure 5:
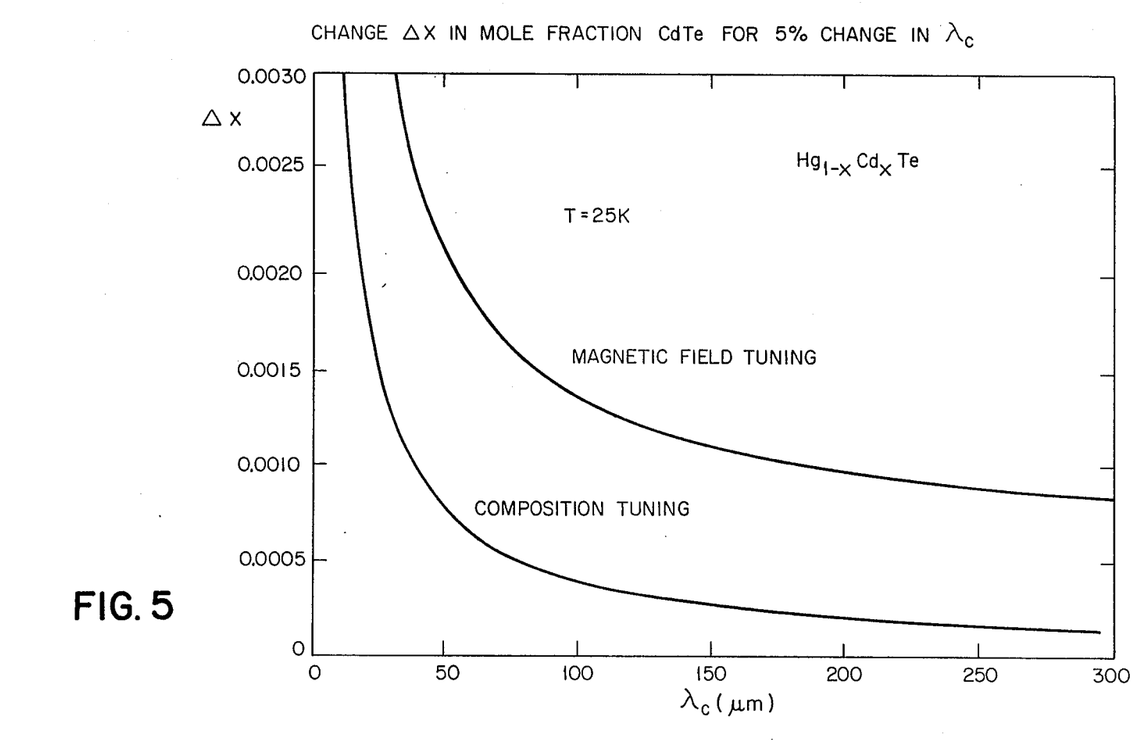
FIG. 5 is a drawing illustrating the calculated change in mole fraction of CdTe for 5% change in cutoff wavelength for the field induced gap detector of the present invention as compared to a composition tuned infrared detector.

In addition to providing a tunable detector in the long wavelength infrared and submillimeter wave regions, not accessible by conventional intrinsic semiconductor photodetectors, the present invention further provides a reduction in composition control requirements for production of the materials as employed in the photodetector. For HgTe there is no problem of composition control. For alloys of HgTe and CdTe the compositional control required for an arbitrary 5% uniformity in cutoff wavelength is shown in FIG. 5. This is compared with the compositional control which would be needed with a conventional alloy semiconductor. It can be seen that the necessary compositional control is much easier for the detector of the present invention. Also, it should be noted that for the detector of the present invention only relative changes are important, since small changes in the absoute value of x can be accommodated by a change in the magnetic field.

While the foregoing description of the infrared detector of the present invention has been in terms of a photovoltaic diode structure, it will be appreciated that the induced band gap detector of the present invention may be fabricated in a wide variety of different configurations. In general, the types of detector employing the induced gap approach of the present invention may be the same as for conventional intrinsic semiconductor materials of the type employed for shorter wavelength detection. For example, such alternate detector designs include photoconductors, MIS detectors, PEM detectors, etc. Accordingly, the above-described embodiment should be viewed as illustrative only.

The present invention further provides a capability not achievable in conventional intrinsic semiconductor photodetectors at any wavelength. More particularly, since the cutoff wavelength is a function of the magnetic field, by varying the magnetic field over time, the cutoff wavelength may be swept through a desired wavelength band. This swept cutoff wavelength may be employed for spectroscopic applications or for sensing a range of wavelengths in a time mutiplexed manner.

Figure 6:
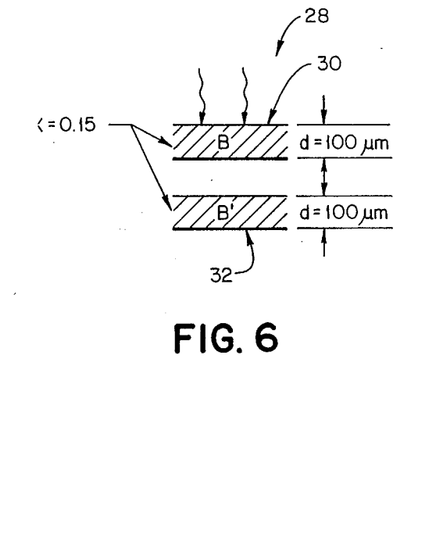
FIG. 6 is a schematic drawing illustrating an infrared detector employing a filter to provide a spectroscopic detection pass band.

Referring to FIG. 6, an embodiment of the present invention providing a narrow pass band infrared detector 28 is illustrated schematically. The pass band detector 28 includes a filter layer 30 configured to be between the source of radiation to be detected and a detector layer 32. In a preferred embodiment, the filter layer 30 and detector layer 32 may both be composed of $Hg_{0.85}Cd_{0.15}Te$. The detector layer 32 will preferably include a photodiode junction (not shown) and electrodes such as described in relation to FIG. 1. The thickness of the filter layer 30 should be chosen to be suitable to provide absorption of substantially all of the incident radiation below the cutoff wavelength. For example, a thickness of 100 microns would be suitable for intensities of infrared radiation typically encountered in sensing applications The filter layer 30 and the detector layer 32 may be spaced apart as illustrated in FIG. 6 or may be physically configured on top of one another, for example, as two layers formed on top of a substrate with a transparent layer formed in between the filter layer 30 and a detector layer 32 of thickness suitable to provide electrical and magnetic separation between the layers. A first magnetic field B is applied to the filter layer 30 and a second reduced magnetic field B' is applied to detector layer 32. This may be achieved by having two separate magnets or by employing a material which will divert some of the field strengths away from the semimetal material in the detector layer 32. Due to the reduced field strength in the detector layer the induced band gap will be less than that in the filter layer. Accordingly, the cutoff wavelength in the filter 30 $\lambda c$ will be shorter than that in the cutoff frequency $\lambda c'$ in the detector layer 32. Thus, the pass band detector 28 will serve to detect only those wavelength in the pass band $\lambda c - \lambda c'$.

Figure 7:
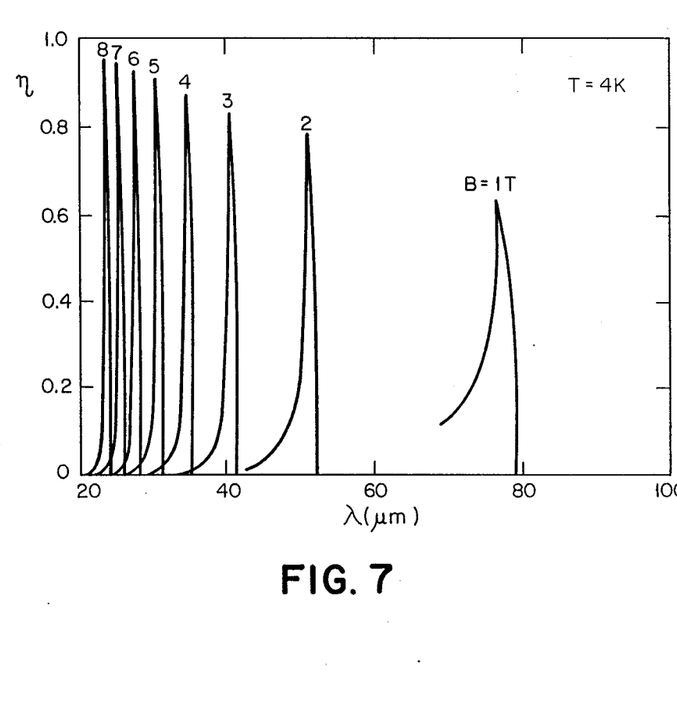
FIG. 7 is a drawing illustrating the pass bands of the filter of FIG. 6 for different applied magnetic field strengths.

In FIG. 7, calculated pass bands are illustrated for various field strengths B, a field strength B' of 95% B, and assuming a thickness of 100 the detector layer the induced band gap will be less than that in the filter layer. Accordingly, the cutoff wavelength in the filter 30 $\lambda c$ will be shorter than that in the cutoff frequency $\lambda c'$ in the detector layer 32. microns for both the filter layer 30 and the detector layer 32. The vertical axis in FIG. 7 is the calculated quantum efficiency $\eta$ of the detector layer 32. It will be appreciated from FIG. 7 that narrow pass bands suitable for spectroscopic applications can be provided. Additionally, by sweeping the magnetic field B applied to the detector 28 of FIG. 6, a swept narrow pass band may be provided.

Figure 8:
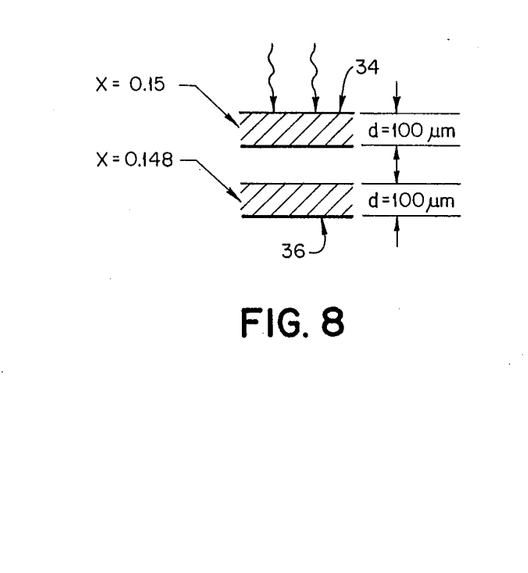
FIG. 8 is a schematic drawing of an alterate embodiment of the infrared detector of FIG. 6.
Figure 9:
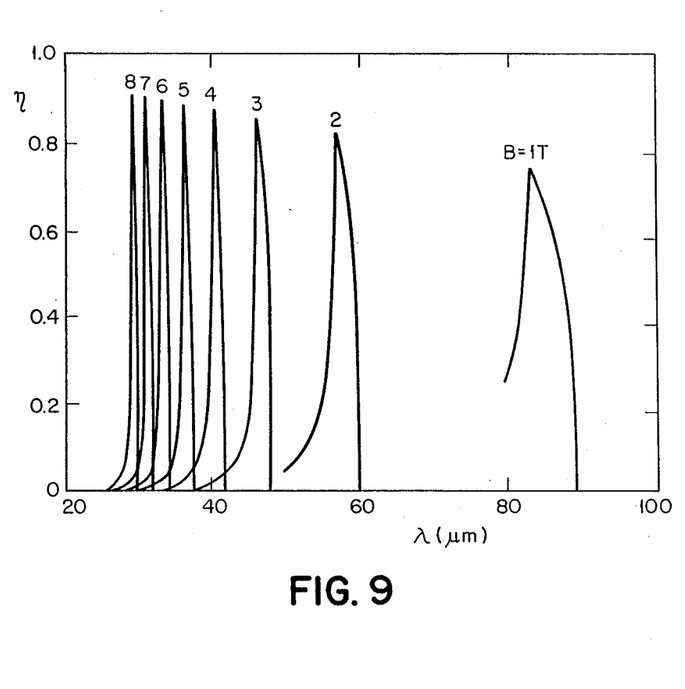
FIG. 9 is a drawing illustrating the pass band structure of the detector of FIG. 8 for various applied magnetic fields.

Referring to FIG. 8, an alternate embodiment of a narrow pass band detector is illustrated employing a filter layer 34 and a detector layer 36 composed of differing composition semimetals. In FIG. 9 the resulting pass band profiles are illustrated. In the embodiment of FIG. 8, the filtering effect is achieved by employing a constant magnetic field B through both the filter layer 34 and detector layer 36 but employing differing compositions in the semimetals such that the band gap induced by the magnetic field B is greater in the filter layer 34 than in the detector layer 36. For example, the semimetal material may be chosen to be $Hg_{1-x}Cd_xTe$, with $x=0.15$ in filter layer 34 and with $x=0.148$ in the detector layer. Assuming a 100 micron thick filter layer 34 and detector layer 36, calculated pass bands are illustrated in FIG. 9. As in the case of the embodiment of FIG. 6, suitable narrow pass bands are provided. Also, the individual pass bands may be swept through the frequency spectrum by sweeping the magnetic field B.

Figure 10:
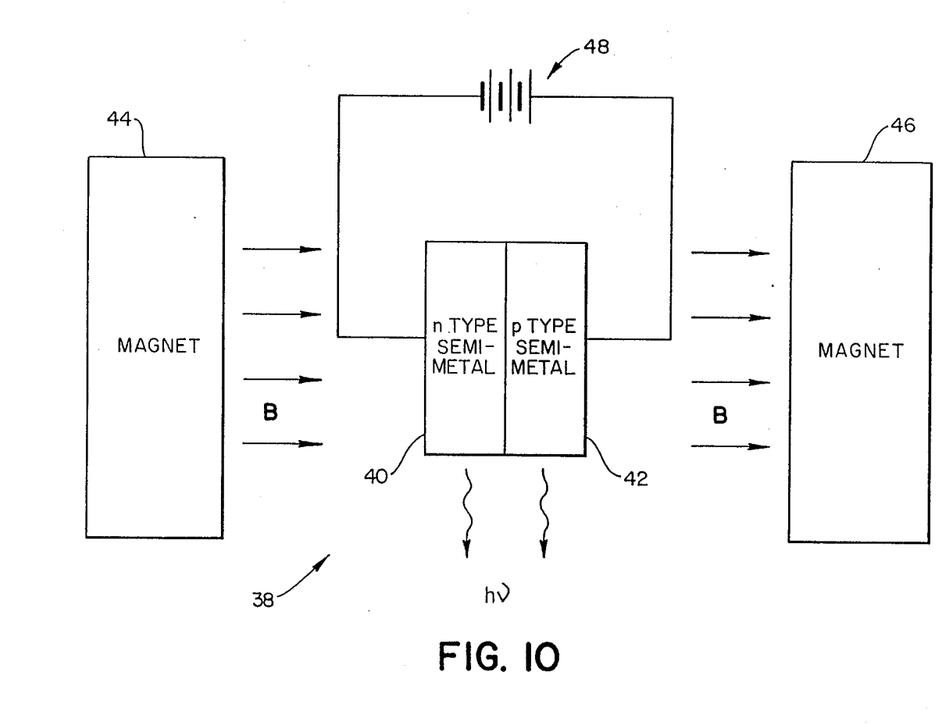
FIG. 10 is a cross-sectional drawing schematically illustrating a tunable infrared emitting diode structure in accordance with the present invention.

Referring to FIG. 10, an alternate embodiment of the present invention is illustrated wherein a tunable light emitting diode structure 38 is provided. The operation of the light emitting diode structure 38 is essentially the reverse of the detector described above in that a field induced band gap may be employed to generate light by electron/hole pair recombination across the induced gap. This is essentially the reverse operation to photodetection by a electron/hole pair creation across an induced band gap. As shown in FIG. 10, the basic light emitting diode structure includes an n type doped semimetal 40 and p type doped semimetal 42 forming a junction region therebetween. In the same manner as described above in relation to FIGS. 2(a) and 2(b), a magnetic field B provided by magnets 44 and 46 induces a band gap in the semimetal layers 40, 42. The n type doped semimetal region 40 and p type doped region 42 are connected to a suitable potential 48 so as to forward bias the junction Due to the potential, the electons in the n type doped region 40 will be pulled into the p type doped region 42 and combine with holes. Similarly holes from region 42 will be drawn into n type region 40, and combine with electrons. In both cases the electron/hole pair recombine to release photons of energy $h\nu$ equal to the induced band gap energy. This will thus result in emission of radiation at a tailorable frequency related to the magnetic field strength B. The relationship between induced band gap energy and magnetic field strength, discussed above may be directly applied in selecting a magnetic field and semimetal combination to provide a desired emission wavelength from the light emitting diode structure 38.

It will be appreciated that the foregoing description of the light emitting structure 38 is highly illustrative and the induced band gap structure may be employed to generate light in a variety of structures. Generally such structures will be the same as employed for conventional semiconductor materials employed in light emitting diode and laser applications.

It will be appreciated to those skilled in the art that a wide variety of modifications to the above-described preferred embodiments are possible while remaining within the scope of the present invention. Accordingly, the aforedescribed embodiment should be considered as purely illustrative and not as limiting the scope of the present invention.

What is claimed is:

1. A method for detecting long wavelength infrared radiation comprising the steps of:
   (a) providing a vanishing band gap semimetal material;
   (b) applying a magnetic field to said semimetal material of strength sufficient to induce a band gap in said material of energy corresponding to the energy of the infrared radiation to be detected; and
   (c) detecting infrared radiation incident on said material by detecting electron/hole pairs created in the material by the incident infrared radiation.

2. The method for detecting long wavelength infrared radiation as set out in claim 1, wherein said semimetal material is selected from the group consisting of HgCdTe, HgCdSe, BiSb, $\alpha$-Sn, HgMgTe, HgMnTe, HgZnTe, HgMnSe, HgMgSe, HgZnSe and the graphite form of carbon.

3. The method for detecting long wavelength infrared radiation as set out in claim 1, wherein said material is $Hg_{1-x}Cd_xTe$, $x<0.15$, wherein said magnetic field has a strength greater than 1 Tesla.

4. The method for detecting long wavelength infrared radiation as set out in claim 1, further comprising the step of sweeping the strength of said magnetic field through a predetermined range.

5. An infrared detector having tunable wavelength detection characteristics, comprising:
   a diode structure formed from a semimetal material having a vanishing band gap between the valence and conduction bands;
   means for providing a magnetic field to said diode structure;
   first and second electrodes coupled to said diode structure; and
   means coupled to said electrodes for detecting changes in potential therebetween in response to infrared radiation incident on said diode structure.

6. An infrared detector as set out in claim 5, wherein the semimetal material is selected from group consisting of HgCdTe, HgCdSe, BiSb, α-Sn, HgMgTe, HgMnTe, HgZnTe, HgMnSe, HgMgSe, HgZnSe and the graphite form of carbon.

7. An infrared detector as set out in claim 5, wherein the semimetal material is $Hg_{1-x}Cd_xTe$, where x is in the range of less than 0.15.

8. An infrared detector as set out in claim 7, wherein the magnetic field has a strength of from approximately 1-10 Tesla.

9. An infrared detector as set out in claim 5, further comprising a filter layer of said semimetal material and means for providing a second magnetic field to said filter layer of semimetal material, said second magnetic field having a higher field strength than said first magnetic field.

10. An infrared detector as set out in claim 9, wherein said second magnetic field is approximately 5% stronger than said first magnetic field.

11. An infrared detector as set out in claim 5, further comprising a filter, said filter comprising a thin layer of a semimetal material having a composition differing from said semimetal material comprising said diode structure.

12. An infrared detector as set out in claim 11, wherein said semimetal material is $Hg_{1-x}Cd_xTe$, and wherein $x=0.148$ in said diode structure and $x=0.15$ in said filter.

13. A method for generating electromagnetic radiation of variable wavelength, comprising the steps of:
   providing a semimetal material in a diode type structure having a junction between the first and second conductivity types;
   applying a magnetic field to said semimetal material so as to induce a non-zero band gap in said semimetal material; and
   applying a voltage in a forward bias direction across said junction so as to cause hole/electron recombination at said junction and emission of electromagnetic energy of a wavelength corresponding to the induced non-zero band gap energy.

14. The method for generating electromagnetic energy as set out in claim 13, wherein said zero band gap material is a semimetal selected from the group consisting of HgCdTe, HgCdSe, BiSb, α-Sn, HgMgTe, HgMnTe, HgZnTe, HgMnSe, HgMgSe, HgZnSe and the graphite form of carbon.

15. A method for generating electromagnetic energy wavelength as set out in claim 13, wherein said magnetic field is in the range of 2-10 Tesla.

16. A method for generating electromagnetic energy wavelength as set out in claim 13, wherein semimetal material is $Hg_{1-x}Cd_xTe$, wherein x may be varied to vary the induced band gap energy.

\* \* \* \* \*